(12) United States Patent
Omote

(10) Patent No.: US 7,656,206 B2
(45) Date of Patent: Feb. 2, 2010

(54) PHASE-LOCKED LOOP CIRCUIT

(75) Inventor: Kazuyuki Omote, Tokyo (JP)

(73) Assignee: Thine Electronics, Inc., Tokyo (JP)

( * ) Notice: Subject to any disclaimer, the term of this patent is extended or adjusted under 35 U.S.C. 154(b) by 147 days.

(21) Appl. No.: 11/976,538

(22) Filed: Oct. 25, 2007

(65) Prior Publication Data

US 2008/0100355 A1    May 1, 2008

Related U.S. Application Data

(63) Continuation of application No. PCT/JP2005/008134, filed on Apr. 28, 2005.

(51) Int. Cl.
  *H03L 7/06* (2006.01)
(52) U.S. Cl. .................. 327/156; 327/147; 331/14; 331/17; 331/25; 331/57
(58) Field of Classification Search .............. 327/147, 327/156; 331/14, 17, 18, 25, 57
  See application file for complete search history.

(56) References Cited

U.S. PATENT DOCUMENTS

| 4,931,748 | A | * | 6/1990 | McDermott et al. ......... 331/1 A |
| 5,410,572 | A | * | 4/1995 | Yoshida ....................... 375/376 |
| 5,577,086 | A | * | 11/1996 | Fujimoto et al. ............ 375/376 |
| 5,949,261 | A | * | 9/1999 | Field et al. .................. 327/156 |
| 6,114,917 | A | | 9/2000 | Nakajima et al. |
| 6,188,252 | B1 | * | 2/2001 | Kawakami .................. 327/101 |
| 6,252,467 | B1 | | 6/2001 | Yoshimura |
| 6,342,818 | B1 | * | 1/2002 | Segawa et al. ............... 331/14 |
| 6,414,528 | B1 | | 7/2002 | Usui |
| 6,552,618 | B2 | * | 4/2003 | Nelson et al. ................. 331/11 |
| 6,791,421 | B2 | * | 9/2004 | Oita ............................. 331/14 |
| 6,870,411 | B2 | * | 3/2005 | Shibahara et al. ........... 327/156 |
| 2002/0003453 | A1 | | 1/2002 | Segawa et al. |

FOREIGN PATENT DOCUMENTS

| JP | A 5 291888 | 11/1993 |
| JP | A 8-249881 | 9/1996 |
| JP | A 09-148925 | 6/1997 |
| JP | A 11-136123 | 5/1999 |
| JP | A 2000-174616 | 6/2000 |
| JP | A 2000-244285 | 9/2000 |
| JP | A 2003-298415 | 10/2003 |
| WO | WO 00/65717 | 11/2000 |

* cited by examiner

*Primary Examiner*—Lincoln Donovan
*Assistant Examiner*—Patrick O'Neill
(74) *Attorney, Agent, or Firm*—Oliff & Berridge, PLC

(57) ABSTRACT

A voltage controlled oscillator 8 is configured to include a plurality of variable delay circuits 30 that are connected to one another so as to form a ring. Output fixing units 31 each of which fixes, when the voltage controlled oscillator 8 stops operating, the output of a corresponding one of the variable delay circuits 30 are provided. As a result, even if the voltage controlled oscillator 8 that operates by following the frequency of an input clock has changed into an operation stop state, because the output fixing units 31 fix the outputs of the variable delay circuits 30, the output of the voltage controlled oscillator 8 is prevented from being in an inconstant state. Thus, it is possible to ensure that the voltage controlled oscillator 8 oscillates properly when the voltage controlled oscillator 8 resumes or starts its operation.

5 Claims, 9 Drawing Sheets

PHASE-LOCKED LOOP CIRCUIT

TECHNICAL FIELD

The present invention relates to a phase-locked loop (PLL) circuit. In particular, the present invention relates to a PLL circuit that operates intermittently.

BACKGROUND ART

Patent Document 1 discloses an example of a technique to generate a multi-phase clock signal by using a PLL circuit. A configuration of the PLL circuit disclosed in Patent Document 1 will be explained with reference to FIG. 15. As shown in FIG. 15, a PLL circuit 1000 disclosed in Patent Document 1 includes a phase frequency comparator 1001, a charge pump 1002, a low pass filter 1003, a voltage controlled oscillator 1004, and a delay circuit 1005.

The voltage controlled oscillator 1004 oscillates at a frequency in accordance with a controlled voltage and generates an output clock signal. The phase frequency comparator 1001 compares the phase of the output clock signal generated by the voltage controlled oscillator 1004 with the phase of an input clock signal and generates an error signal in accordance with the phase difference. The error signal is integrated by the charge pump 1002 and the low pass filter 1003 and applied to the voltage controlled oscillator 1004 as the controlled voltage.

The delay circuit 1005 includes a plurality of differential buffers and outputs a multi-phase output clock signal by delaying the input clock signal in accordance with the controlled voltage.

As described above, in the PLL circuit, the voltage controlled oscillator is arranged so as to oscillate in accordance with the frequency and the phase of the input clock signal. In this situation, in a case where a clock signal having a frequency that is lower than an operation frequency range of the PLL circuit is input or in a case where the clock signal is stopped, in other words, in a case where the clock signal is fixed so as to be at a high level or a low level, the voltage controlled oscillator stops oscillating because the PLL circuit follows the frequency of the clock signal. However, even while the voltage controlled oscillator is being stopped, generally speaking, electric current is constantly flowing in the analog circuits, such as the phase frequency comparator, the charge pump, and the like, that are included in the PLL circuit. As a result, electric power is consumed wastefully.

To cope with this situation, a PLL circuit has been developed so as to operate intermittently in order to keep the electric power consumption of the PLL circuit itself low. More specifically, when the PLL circuit is not in use, the PLL circuit is put into a sleep (OFF) state so that no electric current is flowing in the analog circuits included in the PLL circuit. Only when the PLL circuit is in use, the PLL circuit is changed into an operation (ON) state from the sleep state.

To the PLL circuit 1000 shown in FIG. 16, a PLL power down signal that puts the PLL circuit 1000 into the sleep state is input from the outside thereof, so that the PLL power down signal is input to the phase frequency comparator 1001, the charge pump 1002, and the voltage controlled oscillator 1004. The phase frequency comparator 1001, the charge pump 1002, and the voltage controlled oscillator 1004 stop operating when the PLL power down signal becomes active.

Patent Document 1: International Publication No. WO00/65717

DISCLOSURE OF THE INVENTION

Problems to be Solved by the Invention

However, when the PLL circuit starts operating out of the sleep state or out of a power-off state, sometimes a problem occurs where the voltage controlled oscillator does not oscillate properly.

FIG. 17 shows, as an example of a voltage controlled oscillator, a configuration of a ring oscillator that includes differential-type variable delay circuits 1100(m). In FIG. 17, S0p/S0n, S1p/S1n, ... S(m−1)p/S(m−1)n, and Smp/Smn are the outputs of the variable delay circuits 1100(0), 1100(1), ... 1100(m−1), and 1100(m), respectively. In this situation, m represents an integer that is equal to or larger than 1.

While the voltage controlled oscillator 1004 is not oscillating, the gains of the variable delay circuits 1100(m) are extremely low. Thus, the outputs such as S0p/S0n, S1p/S1n, ... S(m−1)p/S(m−1)n, and Smp/Smn are in an inconstant state. If the voltage controlled oscillator 1004 is put into an operation state starting from this state, the gain of each of the variable delay circuits 1100(m) is raised so that the voltage controlled oscillator 1004 can be in an oscillation state. However, even if the gain of each of the variable delay circuits 1100(m) is raised, because the outputs of the variable delay circuits 1100(m) have been in the inconstant state, there may be a situation in which the two outputs in any of the variable delay circuits 1100(m) have no potential difference. As a result, a problem arises where the voltage controlled oscillator does not oscillate at all or does not oscillate properly.

In view of the circumstances described above, it is an object of the present invention to provide a PLL circuit that is able to operate in a stable manner when the PLL circuit starts or resumes its operation, for example, immediately after the electric power is turned on or after the PLL circuit has recovered from an operation stop state

Means for Solving the Problems

The present invention provides a phase-locked loop circuit that includes: input clock frequency detecting means for detecting whether a frequency of an input clock has become equal to or lower than a predetermined frequency and for outputting a PLL control signal based on a result of the frequency detection; a PLL unit that includes phase frequency comparing means for detecting a phase difference between a phase of the input clock and an output signal from a voltage controlled oscillator, error signal generating means for generating an error signal in accordance with the detected phase difference, and the voltage controlled oscillator that outputs, based on the error signal, an oscillation signal having a predetermined frequency; and oscillator input voltage fixing means for fixing, in a case where the frequency of the input clock has become equal to or lower than the predetermined frequency, an input voltage of the voltage controlled oscillator so as to be a predetermined high voltage that is specified in advance, based on the PLL control signal.

With this arrangement, even if the voltage controlled oscillator that operates by following the frequency of the input clock is in an operation stop state, the input voltage of the voltage controlled oscillator is fixed so as to be the predetermined high voltage that is specified in advance. Thus, the output of the voltage controlled oscillator is prevented from being in an inconstant state. Consequently, it is possible to ensure that the voltage controlled oscillator oscillates properly, when the voltage controlled oscillator resumes or starts its operation.

It is acceptable for the phase-locked loop circuit described above to have an arrangement in which the input clock frequency detecting means includes a logical operation circuit that performs a logical operation on an external control signal and the result of the frequency detection, the external control signal being input from outside in order to control an operation of the PLL unit; the PLL control signal is an output signal from the operation circuit; and in the case where the frequency of the input clock has become equal to or lower than the predetermined frequency or in a case where the external control signal is a control signal for causing the PLL unit to stop, the oscillator input voltage fixing means fixes the input voltage of the voltage controlled oscillator so as to be the predetermined high voltage that is specified in advance. With this arrangement, it is possible to prevent the output of the voltage controlled oscillator from being in an inconstant state. It is therefore possible to ensure that the voltage controlled oscillator oscillates properly when, for example, the voltage controlled oscillator resumes its operation. Also, it is acceptable for the phase-locked loop circuit described above to have an arrangement in which the oscillator input voltage fixing means fixes, based on the PLL control signal, the input voltage of the voltage controlled oscillator so as to be the predetermined high voltage that is specified in advance, until the power supply voltage exceeds the reference voltage that is higher than the PLL-ON voltage which is the voltage with which the PLL unit is able to oscillate properly even if starting from the low voltage state. With this arrangement, it is possible to ensure that the voltage controlled oscillator starts oscillating with a high frequency in a stable manner when, for example, the voltage controlled oscillator starts or resumes its operation. Consequently, it is possible to shorten the time required in order for the voltage controlled oscillator to become synchronized with the frequency of the input clock. Further, it is acceptable for the phase-locked loop circuit described above to have an arrangement in which the oscillator input voltage fixing means is an NMOS transistor in which a drain is connected to the power supply voltage, while a source is connected to a point between a wiring for the error signal and a ground potential, and the PLL control signal is input to a gate, and the predetermined high voltage is lower than the power supply voltage.

The present invention also provides a phase-locked loop circuit that includes: input clock frequency detecting means for detecting whether a frequency of an input clock has become equal to or lower than a predetermined frequency and for outputting a PLL control signal based on a result of the frequency detection; a PLL unit that includes phase frequency comparing means for detecting a phase difference between a phase of the input clock and an output signal from a voltage controlled oscillator, error signal generating means for generating an error signal in accordance with the detected phase difference, and the voltage controlled oscillator in which a plurality of variable delay circuits that are operable to make a delay in accordance with the error signal are connected to one another so as to form a ring and which is operable to output an oscillation signal having a predetermined frequency; and delay circuit output voltage fixing means for fixing, in a case where the frequency of the input clock has become equal to or lower than the predetermined frequency, an output voltage of at least one of the variable delay circuits so as to be a predetermined voltage that is specified in advance, based on the PLL control signal. With this arrangement, it is possible to prevent the output of the voltage controlled oscillator from being in an inconstant state. It is therefore possible to ensure that the voltage controlled oscillator oscillates properly when the voltage controlled oscillator resumes or starts its operation.

Also, it is acceptable for the phase-locked loop circuit described above to have an arrangement in which the input clock frequency detecting means includes a logical operation circuit that performs a logical operation on an external control signal and the result of the frequency detection, the external control signal being input from outside in order to control an operation of the PLL unit; the PLL control signal is an output signal from the operation circuit; and in the case where the frequency of the input clock has become equal to or lower than the predetermined frequency or in a case where the external control signal is a control signal for causing the PLL unit to stop, the delay circuit output voltage fixing means fixes the output voltage of the at least one of the variable delay circuits so as to be the predetermined voltage that is specified in advance. With this arrangement, it is possible to prevent the output of the voltage controlled oscillator from being in an inconstant state. It is also possible to ensure that the voltage controlled oscillator oscillates properly when, for example, the voltage controlled oscillator resumes its operation. Further, it is acceptable for the phase-locked loop circuit described above to have an arrangement in which the input clock frequency detecting means includes power supply voltage detecting means for detecting whether a power supply voltage has exceeded a reference voltage that is higher than a PLL-ON voltage which is a voltage with which the PLL unit is able to oscillate properly even if starting from a low voltage state; the logical operation circuit performs the logical operation based on the external control signal, the result of the frequency detection, and a result of the power supply voltage detection; and the delay circuit output voltage fixing means fixes, based on the PLL control signal, the output voltage of the at least one of the variable delay circuits so as to be the predetermined voltage that is specified in advance, until the power supply voltage exceeds the reference voltage that is higher than the PLL-ON voltage which is the voltage with which the PLL unit is able to oscillate properly even if starting from the low voltage state. With this arrangement, it is possible to ensure that the voltage controlled oscillator starts oscillating with a high frequency in a stable manner when, for example, the voltage controlled oscillator starts or resumes its operation. Consequently, it is possible to shorten the time required in order for the voltage controlled oscillator to become synchronized with the frequency of the input clock. Furthermore, it is acceptable for the phase-locked loop circuit described above to have an arrangement in which the delay circuit output voltage fixing means is a transistor of which one end is connected to an input terminal of the variable delay circuit, whereas another end is connected to at least one of the power supply voltage, a ground, and the gate, while the PLL control signal is input to the gate; and the delay circuit output voltage fixing means fixes, based on the PLL control voltage, the output voltage of the variable delay circuit so as to be one of the power supply voltage, a ground potential, and a level of the PLL control signal.

EFFECTS OF THE INVENTION

According to the present invention, it is possible to provide a PLL circuit that is able to operate in a stable manner even when the PLL circuit starts or resumes its operation, for example, immediately after the electric power is turned on or when the PLL circuit has recovered from an operation stop state.

BEST MODES FOR CARRYING OUT THE INVENTION

In the following sections, preferred embodiments of the present invention will be explained, with reference to the accompanying drawings.

First Embodiment

Figure 1:
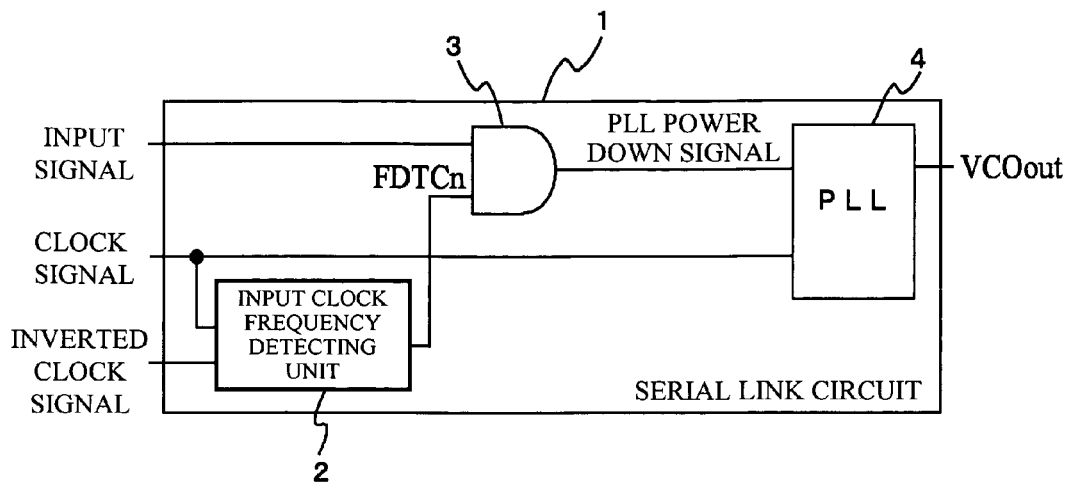
FIG. 1 is a block diagram that shows a configuration of a serial link circuit 1 according to a first embodiment.

First, a configuration of a serial link circuit 1 according to a first embodiment will be explained, with reference to FIG. 1. As shown in FIG. 1, the circuit according to the first embodiment includes an input clock frequency detecting unit 2 that monitors the operational state of a clock signal, an AND gate 3, and a PLL 4.

As shown in FIG. 1, the input clock frequency detecting unit 2 receives inputs of the clock signal and an inverted clock signal obtained by inverting the output of the clock signal and monitors the operational state of the clock signal. When the frequency of the clock signal has become equal to or lower than a predetermined frequency that is specified in advance, the input clock frequency detecting unit 2 outputs a flag signal (FDTCn), which is a detection signal, to the AND gate 3.

The AND gate 3 calculates a logical product of an external control signal that has been input from the outside in order to put the PLL unit 4 into an operation stop state and the flag signal (FDTCn) received from the input clock frequency detecting unit 2 and outputs a PLL power down signal, which is a PLL control signal for exercising control so that the operation of the PLL unit 4 is stopped.

Figure 2:
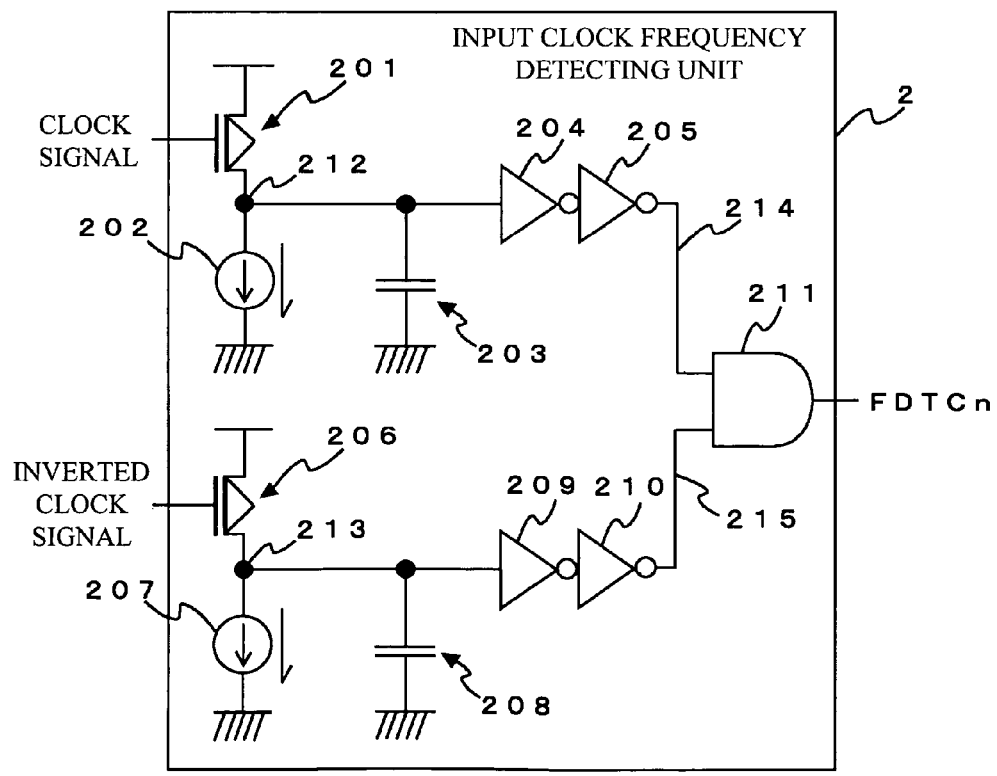
FIG. 2 is a block diagram that shows a configuration of an input clock frequency detecting unit 2.

FIG. 2 shows a detailed configuration of the input clock frequency detecting unit 2. The input clock frequency detecting unit 2 includes: a first PMOS transistor 201 in which the source is connected to the power supply voltage, the clock signal is input to the gate, and the drain is connected to a node 212; a second PMOS transistor 206 in which the source is also connected to the power supply voltage, the inverted clock signal is input to the gate, and the drain is connected to a node 213; a current source 202 that is connected to a position between the node 212 and the ground; and a current source 207 that is connected to a position between the node 213 and the ground. To the node 212, one of the ends of a capacitor 203 and an input terminal of an inverter 204 are connected, the other end of the capacitor 203 being connected to the ground, and the inverter 204 and another inverter 205 being connected in series. An output terminal of the inverter 205 is connected to a first branch 214. Similarly, to the node 213, one of the ends of a capacitor 208 and an input terminal of an inverter 209 are connected, the other end of the capacitor 208 being connected to the ground, and the inverter 209 and another inverter 210 being connected in series. An output terminal of the inverter 210 is connected to a second branch 215. The other end of the first branch 214 and the other end of the second branch 215 are each connected to an input terminal of an AND gate 211. An output of the AND gate 211 serves as an output of the input clock frequency detecting unit 2.

Next, an operation of the input clock frequency detecting unit 2 configured as described above will be explained. When the clock signal that has been input to the input clock frequency detecting unit 2 is equal to or higher than a predetermined frequency that is specified in advance, an electric charge is stored into the capacitors 203 and 208 via the first PMOS transistor 201 and the second PMOS transistor 206 that are connected to the power supply voltage. When the electric potentials at the other end of the capacitor 203 and at the other end of the capacitor 208 become higher so as to exceed the threshold voltages of the inverters 204 and 205 and the inverters 209 and 210, high level signals are input to the AND gate 211 from the first branch 214 and the second branch 215, so that the flag signal FDTCn changes to a high level.

When the clock signal stops, or when the frequency of the clock signal has become equal to or lower than the predetermined frequency that is specified in advance, the electric potential of one or both of the capacitors 203 and 208 becomes lower. The reason is that the amount of electric current that escapes from the current source 202 to the ground is larger than the electric charge amount supplied from the first PMOS transistor 201 to the capacitor 203, and also that the amount of electric current that escapes from the current source 207 to the ground is larger than the electric charge amount supplied from the second PMOS transistor 206 to the capacitor 208. When the electric potentials at the other end of the capacitor 203 and at the other end of the capacitor 208 become lower so as to be lower than the threshold voltages of the inverters 204 and 205 and the inverters 209 and 210, the flag signal FDTCn that is output from the AND gate 211 changes from the high level to a low level. The input clock frequency detecting unit 2 informs the PLL unit 4, via the AND gate, that the clock signal has stopped or that the clock signal has become equal to or lower than an operation lower limit frequency, by changing the flag signal FDTCn to the low level. In the description of the present embodiment, the example is explained in which the flag signal FDTCn from the AND gate 211 being changed to the low level indicates that the clock signal has stopped or the frequency of the clock signal has become equal to or lower than the arbitrary frequency. However, another arrangement is acceptable in which the flag signal FDTCn from the AND gate 211 being changed to the high level indicates that the clock signal has stopped or the frequency of the clock signal has become equal to or lower than the arbitrary frequency.

It is possible to specify the predetermined frequency according to which the flag signal FDTCn is changed to the low level or to the high level, based on the power supply voltage, the length and the width of the transistors, the amounts of electric current of the current sources, the capacities of the capacitors, and the threshold voltages of the inverters.

Figure 3:
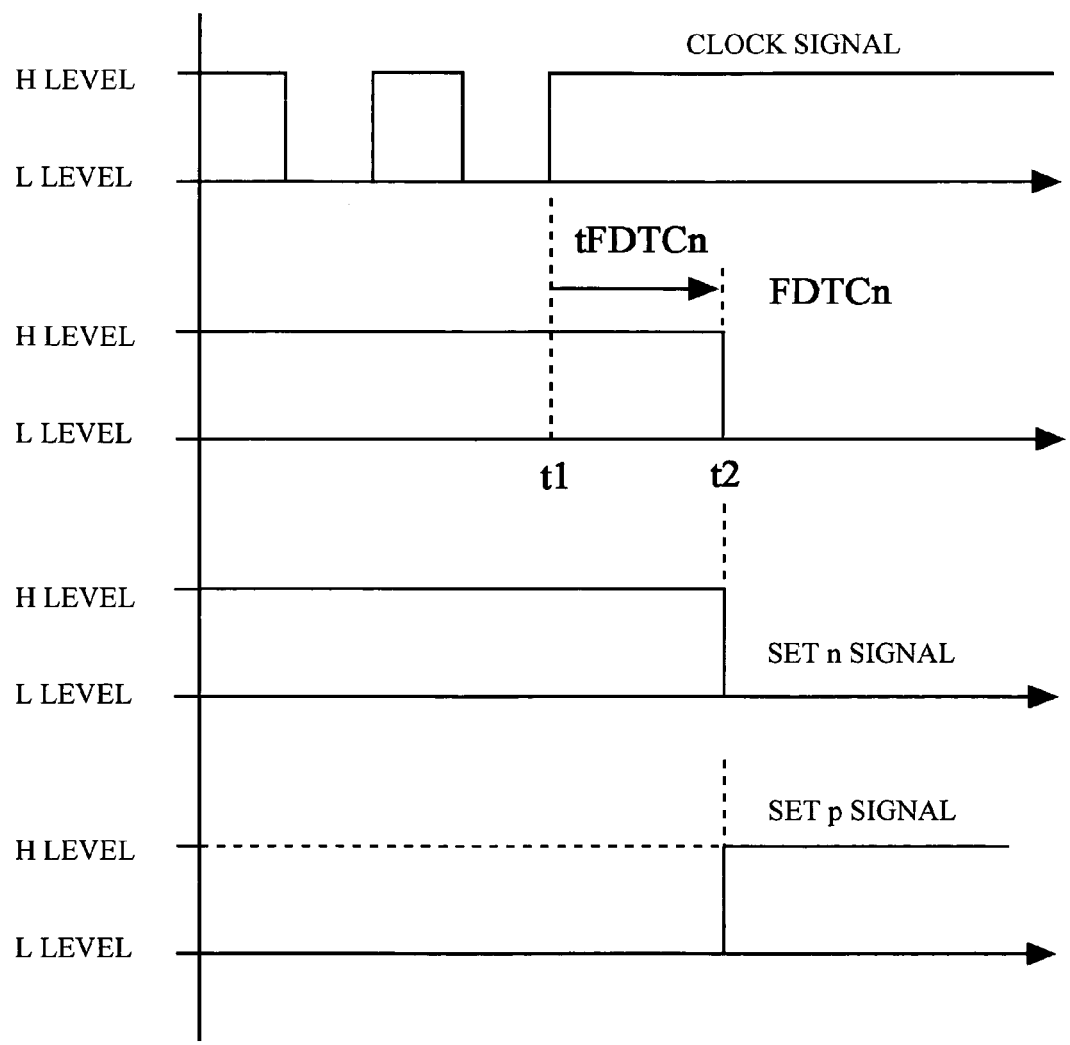
FIG. 3 is a timing chart that shows operation timing of the serial link circuit 1.

FIG. 3 is an operation timing chart of the input clock frequency detecting unit 2. When the clock signal stops while being at the high level, the flag signal FDTCn changes from the high level to the low level after a period of time tFDTCn (=t2−t1) has elapsed as shown in FIG. 3. It is possible to specify the period of time, namely tFDTCn, between when the output of the clock signal stops and when the flag signal FDTCn is output, so as to be an arbitrary length of time, by changing the capacities of the capacitors 203 and 208 and the amount of electric current that flows into the ground. The length of the period of time tFDTCn is specified in accordance with the cycle of the clock signal to be detected. For example, when the frequency of the clock signal is 5 MHz, tFDTCn is specified so as to be approximately 200 ns.

The AND gate 3 calculates the logical product of the flag signal FDTCn and the external control signal. Thus, as a result of the clock signal becoming equal to or lower than the operation lower limit frequency or as a result of the external control signal having been input, it is possible to put the PLL unit 4 into the operation stop state. In the description of the first embodiment, the example is explained in which the AND gate calculates the logical product of the flag signal FDTCn and the external control signal. However, another arrangement is acceptable in which the flag signal FDTCn is directly input to the PLL unit 4, without the PLL power down signal being dependent on the external control signal. Even in the case where the flag signal FDTCn is directly input to the PLL unit 4, it is possible to put the PLL unit 4 into the operation stop state when the clock signal has become equal to or lower than the operation lower limit frequency.

Figure 4:
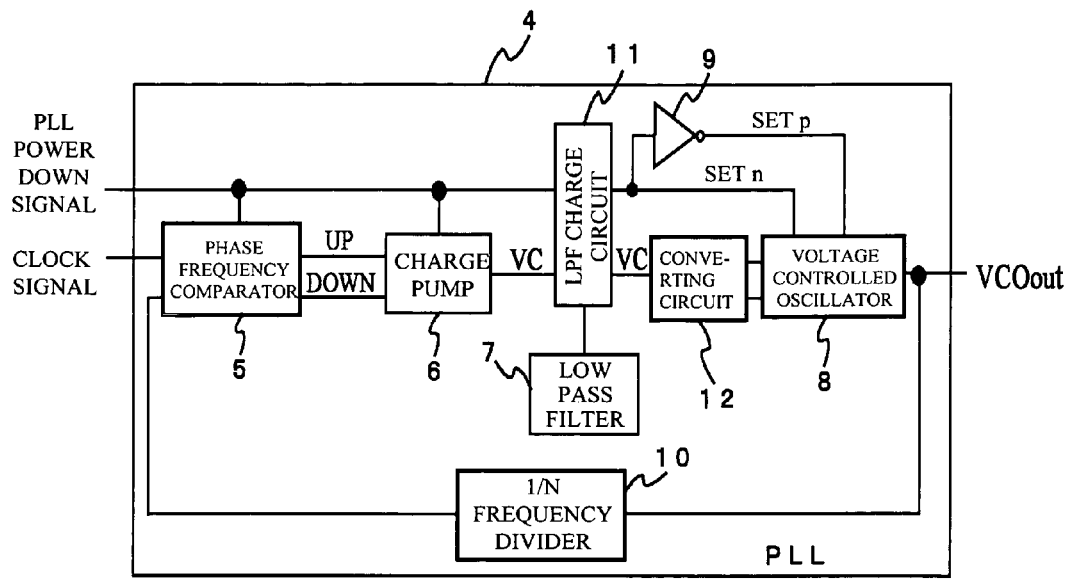
FIG. 4 is a block diagram that shows a configuration of a PLL 4.

Next, a configuration of the PLL unit 4 will be explained. As shown in FIG. 4, the PLL unit 4 includes a phase frequency comparator 5, a charge pump 6, a low pass filter (hereinafter, it may be simply referred to as an "LPF") 7, a converting circuit 12, a voltage controlled oscillator 8, an inverter 9 that inverts the output of the PLL power down signal, a 1/N frequency divider 10, and an LPF charge circuit 11 that serves as an oscillator input voltage fixing unit.

The phase frequency comparator 5 detects a phase difference between the clock signal that has been input thereto and a feedback signal from the 1/N frequency divider 10 and outputs an error signal (UP or DOWN) that is in accordance with the phase difference and is to be used for raising or lowering the oscillation frequency of the voltage controlled oscillator 8. In a case where the phase of the feedback signal is behind the clock signal, the phase frequency comparator 5 outputs the error signal (UP) that raises the oscillation frequency of the voltage controlled oscillator 8 for a period of time that corresponds to the phase difference. On the contrary, in a case where the feedback signal is ahead of the clock signal, the phase frequency comparator 5 outputs the error signal (DOWN) that lowers the oscillation frequency of the voltage controlled oscillator 8 for a period of time that corresponds to the phase difference. As explained here, the phase frequency comparator 5 outputs the signal obtained by performing a pulse width modulation on the phase difference between the two signals that have been input thereto.

Figure 5:
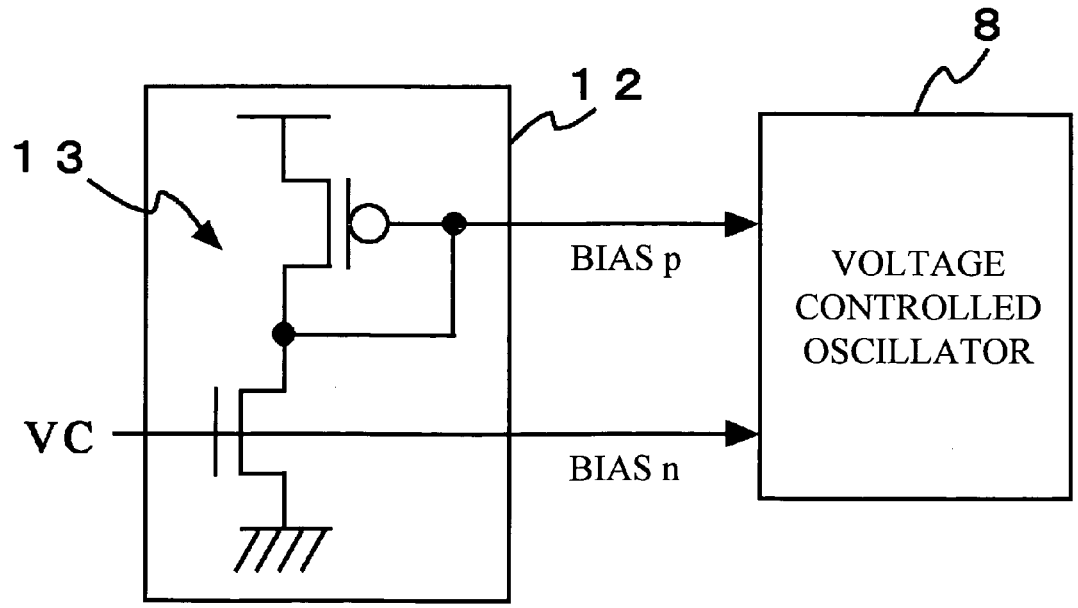
FIG. 5 is a diagram that shows a configuration of a converting circuit 12.
Figure 8:
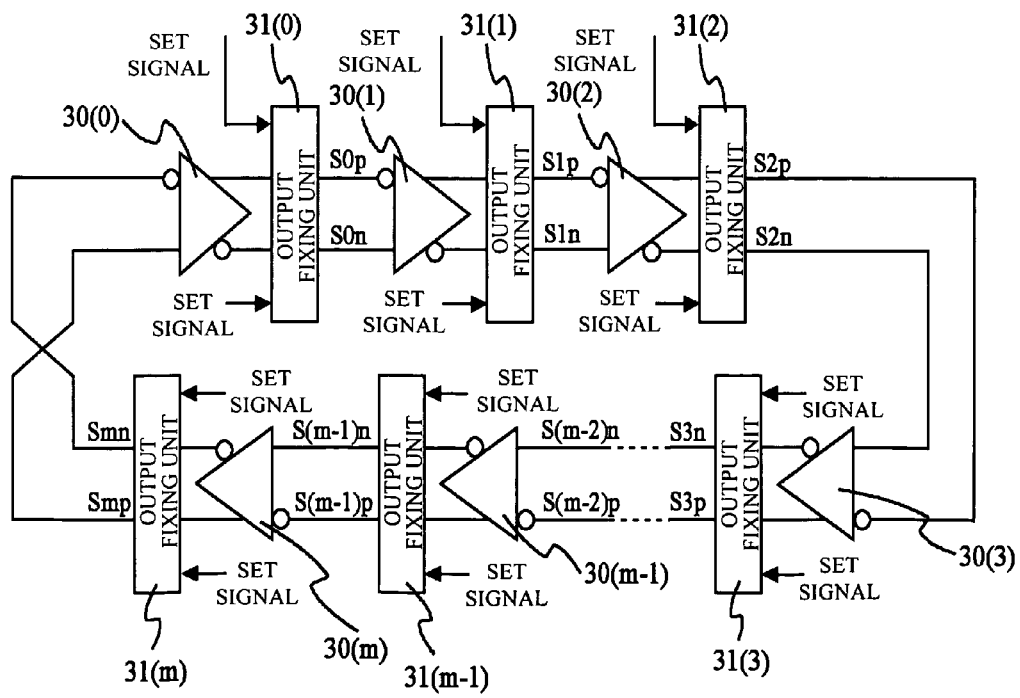
FIG. 8 is a diagram that shows a configuration of a voltage controlled oscillator 8.

The charge pump 6 converts the error signal (UP or DOWN) from the phase frequency comparator 5 into an analog signal. The output signal that has been converted into the analog signal is input to the converting circuit 12 through the low pass filter 7, as a control voltage (VC), and is then converted by the converting circuit 12 into a control signal for controlling the voltage controlled oscillator 8. The low pass filter 7 includes a resistance 701 and a capacitance 702. The low pass filter 7 reduces high frequency noise or the like contained in the output signal from the charge pump 6 and also stabilizes the feedback loop. The converting circuit 12 is a circuit that converts the control voltage (VC) from the charge pump 6 into a bias p signal and a bias n signal, which are control signals used in variable delay circuits explained later. As shown in FIG. 5, the bias p signal is output as an output signal from an amplifier 13 included in the converting circuit 12. As the bias n signal, the control voltage (VC) from the charge pump 6 is used as it is. By using the control voltage (VC) output from the charge pump 6, it is possible to control the oscillation frequency of the voltage controlled oscillator 8. By making the control voltage (VC) higher, it is possible to make the oscillation frequency of the voltage controlled oscillator 8 higher. Also, in a case where variable delay circuits 30 that are included in the voltage controlled oscillator 8 are configured with differential amplifiers as shown in FIG. 8 explained later, by making the value of the control voltage (VC) higher, it is possible to make the gains of the differential amplifiers larger and to make the oscillation frequency of the voltage controlled oscillator 8 higher.

The output signal from the voltage controlled oscillator 8 is output as an output signal (VCOout) from the serial link circuit 1 and is also input to the phase frequency comparator 5 as the feedback signal after the frequency is divided by the 1/N frequency divider 10. In this situation, the 1/N frequency divider 10 converts the signal VCOout into the feedback signal having a frequency that is 1/N of the frequency of the signal VCOout.

As shown in FIG. 4, the PLL power down signal is input to the phase frequency comparator 5 and to the charge pump 6. When the PLL power down signal becomes active, the phase frequency comparator 5 and the charge pump 6 stop operating. Also, a set n signal that is the output of the PLL power down signal being used as it is and a set p signal that is obtained by inverting the output of the PLL power down signal with the use of the inverter 9 are input to the voltage controlled oscillator 8. When the set n signal becomes active, the voltage controlled oscillator 8 stops operating.

Figure 6A:
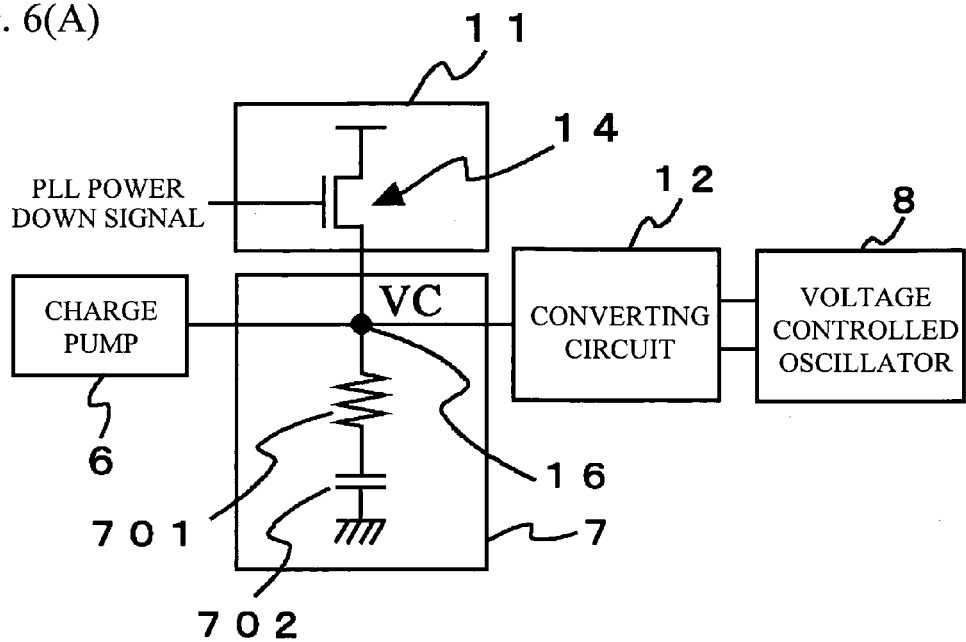
FIGS. 6(A) and 6(B) are diagrams each of which shows a configuration of an LPF charge circuit 11.
Figure 6B:
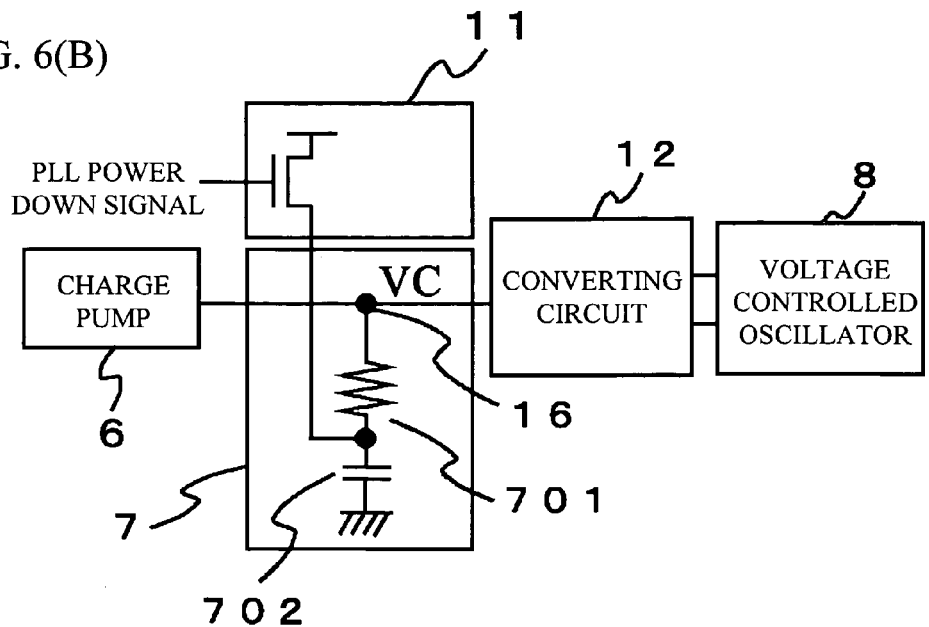

FIG. 6 shows a detailed configuration of the LPF charge circuit 11 that serves as the oscillator input voltage fixing unit and is operable to specify the oscillation frequency of the voltage controlled oscillator 8 when the voltage controlled oscillator 8 has stopped operating. As shown in FIG. 6(A), the LPF charge circuit 11 includes an NMOS transistor 14 in which the drain is connected to a power supply voltage, while the source is connected to a node 16, and the PLL power down signal is input to the gate. When the serial link circuit 1 is in an operation stop state, in other words, when the PLL power down signal becomes active (i.e., the low level), the LPF charge circuit 11 charges, via the NMOS transistor 14, the electric potential VC at the node 16 that is connected to the charge pump 6 up to an electric potential obtained by subtracting the threshold voltage of the NMOS transistor 14 from the power supply potential (hereinafter, the electric potential obtained by the subtraction will be simply expressed as "VCC—the NMOS transistor 14 threshold voltage"). The connection destination of the NMOS transistor 14 may be an output of the charge pump 6 as shown in FIG. 6(A) or may be a position between the resistance 701 and the capacitance 702 as shown in FIG. 6(B). As explained earlier, by using the voltage at the node 16, in other words, by using the control voltage (VC), it is possible to control the oscillation frequency of the voltage controlled oscillator 8. Accordingly, when the serial link circuit 1 has changed into an operation stop state, by setting the control voltage (VC) to a predetermined high voltage with the use of the LPF charge circuit 11, it is possible to ensure that the voltage controlled oscillator 8 starts oscillating with a high frequency in a stable manner because the variable delay circuits 30 that are included in the voltage controlled oscillator 8 start operating with a high gain when the operation stop state is cancelled.

Figure 7:
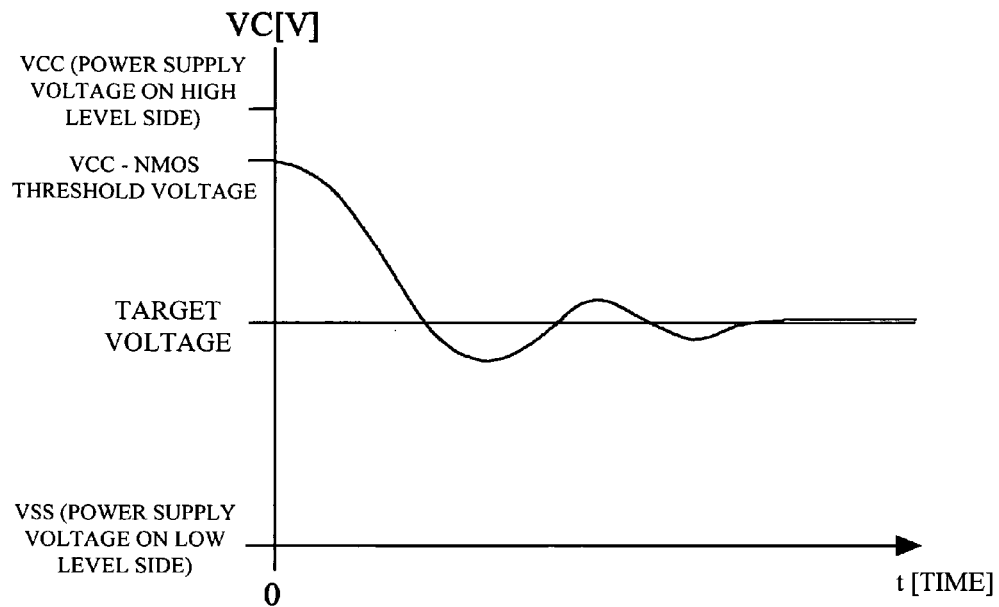
FIG. 7 is a diagram that shows changes in the electric potential of a node VC.

FIG. 7 shows changes in the electric potential at the node 16 after the operation stop state is cancelled, the node 16 having been charged up to the level of "VCC–the NMOS transistor 14 threshold voltage" during the operation stop state. As shown in FIG. 7, the control voltage (VC), which has been charged up to the level of "VCC–the NMOS transistor 14 threshold voltage" during the operation stop state, changes as time elapses after the operation stop state is cancelled and settles down to a target voltage shown in FIG. 7. The target voltage is the electric potential at the node 16 when the clock signal is locked by the serial link 1. In FIG. 7, VCC indicates the power supply voltage on the high level side, while VSS indicates the power supply voltage on the low level side. In the present embodiment, the node 16 is charged by the NMOS transistor 14 so that the electric potential of the node VC is raised only up to the level of "VCC–the NMOS transistor 14 threshold voltage" shown in FIG. 7. This is because, if the node 16 was charged up to the power supply voltage by using the PMOS transistor, the oscillation frequency of the voltage controlled oscillator 8 would become too high and might exceed an operation frequency range of the phase frequency comparator 5, and there might be a possibility that the circuit would not operate as a PLL.

Next, a configuration of the voltage controlled oscillator 8 will be explained, with reference to FIG. 8. The voltage controlled oscillator 8 according to the present embodiment is configured with a ring oscillator in which, as shown in FIG. 8, m+1 stages of variable delay circuits, namely 30(0), 30(1), . . . , 30(k), . . . , 30(m−1) and 30(m), are connected to one another so as to form a ring. On the output side of each of the variable delay circuits 30, a corresponding one of the output fixing units 31(0), 31(1), . . . 31(k), . . . 31(m−1) and 31(m) that is operable to fix the output of the variable delay circuit is provided (where k is an arbitrary value from 0 to m, while m is an arbitrary integer that is equal to or larger than 1). To each of the output fixing units 31, set signals that are made of up a set n signal and a set p signal are input.

Figure 9:
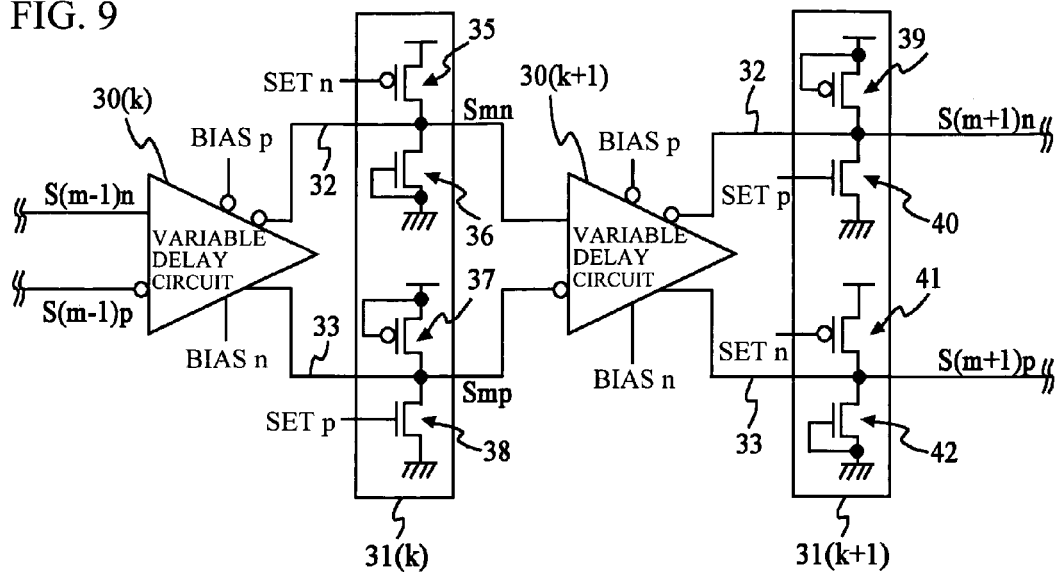
FIG. 9 is a diagram that shows configurations of output fixing units 31.

An example of a configuration of the ring oscillator is shown in FIG. 9. FIG. 9 shows configurations of the variable delay circuit 30(k) and 30(k+1) that are included in the ring oscillator. Differential buffers each of which has two inputs and two output terminals are used as the variable delay circuits 30(k) and 30(k+1). To each of all the variable delay circuits 30 that are included in the ring oscillator, the control signals that are made up of the bias p signal and the bias n signal and that have been generated by the converting circuit 12 are input. The bias p signal and the bias n signal are generated from the control voltage VC output by the charge pump 6, as explained above. Thus, by controlling the control voltage VC (in other words, by controlling the node 16 shown in FIG. 6), it is possible to control the gains of the variable delay circuits 30. To be more specific, by setting the control voltage (VC) to a predetermined high voltage, it is possible to ensure that the voltage controlled oscillator 8 starts oscillating with a high frequency in a stable manner, because the variable delay circuits 30 included in the voltage controlled oscillator 8 start operating with a high gain. The output fixing unit 31(k) is provided at the output terminal of the variable delay circuit 30(k), while the output fixing unit 31(k+1) is provided at the output terminal of the variable delay circuit 30(k+1).

The output fixing unit 31(k) provided at the variable delay circuit 30(k) fixes a first output terminal 32 of the variable delay circuit 30(k) so as to be at a high level and fixes a second output terminal 33 so as to be at a low level, in accordance with the set n signal and the set p signal. The output fixing unit 31(k+1) provided at the variable delay circuit 30(k+1) fixes a first output terminal 32 of the variable delay circuit 30(k+1) so as to be at a low level and fixes a second output terminal 33 so as to be at a high level.

Connected to the first output terminal 32 of the variable delay circuit 30(k) are: the drain of a PMOS transistor 35 in which the source is connected to the power supply voltage, and the set n signal is input to the gate; and the drain of an NMOS transistor 36 in which the source is connected to the ground, and the source and the gate are connected to each other. Connected to the second output terminal 33 of the variable delay circuit 30(k) are: the drain of a PMOS transistor 37 in which the source is connected to the power supply voltage, and the gate and the source are connected to each other; and the drain of an NMOS transistor 38 in which the source is connected to the ground, and the set p signal is input to the gate.

Connected to the first output terminal 32 of the variable delay circuit 30(k+1) are: the drain of a PMOS transistor 39 in which the source is connected to the power supply voltage, and the gate and the source are connected to each other; and the drain of an NMOS transistor 40 in which the source is connected to the ground, and the set p signal is input to the gate. Connected to the second output terminal 33 that is fixed so as to be at the high level are: the drain of a PMOS transistor 41 in which the source is connected to the power supply voltage, and the set n signal is input to the gate; and the drain of an NMOS transistor 42 in which the source is connected to the ground, and the gate and the source are connected to each other.

Next, the timing with which the output terminals of the variable delay circuits 30 are fixed will be explained with reference to the timing chart shown in FIG. 3. As shown in FIG. 3, in a case where the clock signal is stopped while being at a high level, the flag signal FDTCn changes from the high level to the low level after the period of time tFDTCn (=t2−t1) shown in FIG. 3 has elapsed. Accordingly, the PLL power down signal output from the AND gate 3 becomes low active. As shown in FIG. 4, the set n signal that is input to the output fixing units 31 of the variable delay circuits 30 changes to a low active level, whereas the set p signal that is input via the inverter 9 changes to a high active level. In the PMOS transistor 35 that is provided at the first output terminal 32 of the variable delay circuit 30(k) and in the PMOS transistor 41 that is provided at the second output terminal 33 of the variable delay circuit 30(k+1) that are shown in FIG. 9, the output terminals are fixed so as to be at the high level because the set n signal changes to the low level. In the NMOS transistor 38 that is provided at the second output terminal 33 of the variable delay circuit 30(*k*) and in the NMOS transistor 40 that is provided at the first output terminal 32 of the variable delay circuit 30(*k*+1), the output terminals are fixed so as to be at the low level because the set p signal changes to the high level.

As explained above, according to the present embodiment, even if the voltage controlled oscillator 8 that operates by following the frequency of the input clock signal has changed into the operation stop state, the outputs of the variable delay circuits 30 are fixed by the output fixing units 31 and are therefore prevented from being in an inconstant state. As a result, the PLL is able to operate in a stable manner when the PLL starts or resumes its operation, for example, immediately after the electric power is turned on or after the PLL has recovered from an operation stop state.

With regard to the output fixing unit 31(*k*) shown in FIG. 9, the PMOS transistors and the NMOS transistors are provided at the first output terminal 32 and the second output terminal 33 in such a manner that the first output terminal 32 and the second output terminal 33 have an equal load. However, it is acceptable to have other arrangements in which the output fixing unit 31(*k*) has simpler configurations as shown in FIGS. 10(A) and 10(B), and FIGS. 10(C) and 10(D).

Figure 10A:
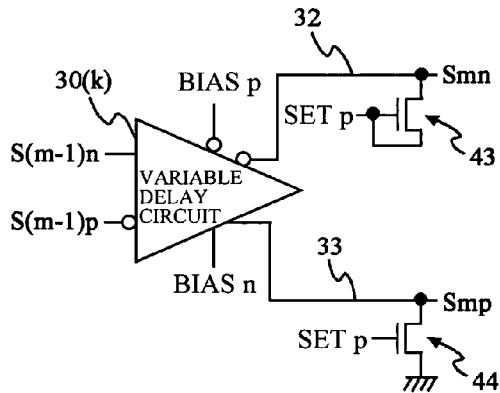
FIGS. 10(A), 10(B), 10(C), AND 10(D) show diagrams each of which illustrates a configuration of a ring oscillator that includes variable delay circuits 30 configured with differential amplifiers and the output fixing units 31.

FIG. 10(A) shows an example of the other configurations of the output fixing unit 31(*k*) in which the first output terminal 32 is fixed so as to be at the high level, whereas the second output terminal 33 is fixed so as to be at the low level. Connected to the first output terminal 32 is the source of an NMOS transistor 43 in which the set p signal is input to the gate, and the gate and the drain are connected to each other. Connected to the second output terminal 33 is the drain of an NMOS transistor 44 in which the source is connected to the ground, and the set p signal is input to the gate. With this arrangement also, when the set p signal is at the high level, the first output terminal 32 is fixed so as to be at the high level, whereas the second output terminal 33 is fixed so as to be at the low level.

Figure 10B:
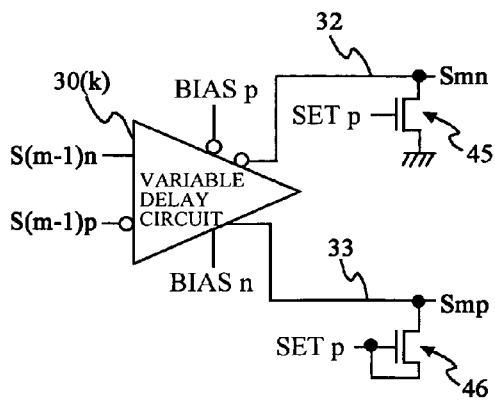

FIG. 10(B) shows another configuration that is similar to the one shown in FIG. 10(A) and in which the first output terminal 32 is fixed so as to be at the low level, whereas the second output terminal 33 is fixed so as to be at the high level. Connected to the first output terminal 32 that is fixed so as to be at the low level is the source of an NMOS transistor 45 in which the source is connected to the ground, and the set p signal is input to the gate. Connected to the second output terminal 33 that is fixed so as to be at the high level is the source of an NMOS transistor 46 in which the set p signal is input to the gate, and the gate and the drain are connected to each other.

Figure 10C:
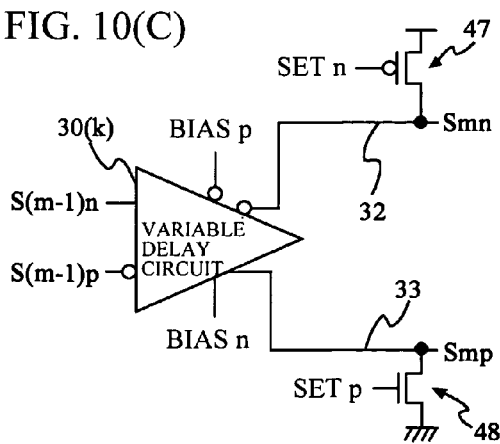

FIG. 10(C) shows another example of the other configurations of the output fixing unit 31(*k*) in which the first output terminal 32 is fixed so as to be at the high level, whereas the second output terminal 33 is fixed so as to be at the low level. Connected to the first output terminal 32 is the drain of a PMOS transistor 47 in which the source is connected to the power supply voltage, and the set n signal is input to the gate. Connected to the second output terminal 33 is the drain of an NMOS transistor 48 in which the source is connected to the ground, and the set p signal is input to the gate.

Figure 10D:
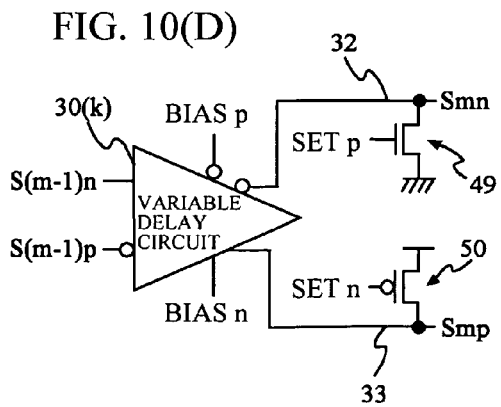

FIG. 10(D) shows another configuration which is similar to the one shown in FIG. 10(C) and in which the first output terminal 32 is fixed so as to be at the low level, whereas the second output terminal 33 is fixed so as to be at the high level. Connected to the first output terminal 32 that is fixed so as to be at the low level is the drain of an NMOS transistor 49 in which the source is connected to the ground, and the set p signal is input to the gate. Connected to the second output terminal 33 that is fixed so as to be at the high level is the drain of a PMOS transistor 50 in which the source is connected to the power supply voltage, and the set n signal is input to the gate.

It is also acceptable to use single-end variable delay circuits (i.e., inverters) in the voltage controlled oscillator 8. In this situation, the number of stages of the variable delay circuits will be an odd number. Like in the differential-type ring oscillator, by arranging the control signal of the set n signal so as to be at the low level, and arranging the control signal of the set p signal so as to be at the high level, it is possible to fix the outputs of the variable delay circuits so as to be at the low level or at the high level.

Figure 11:
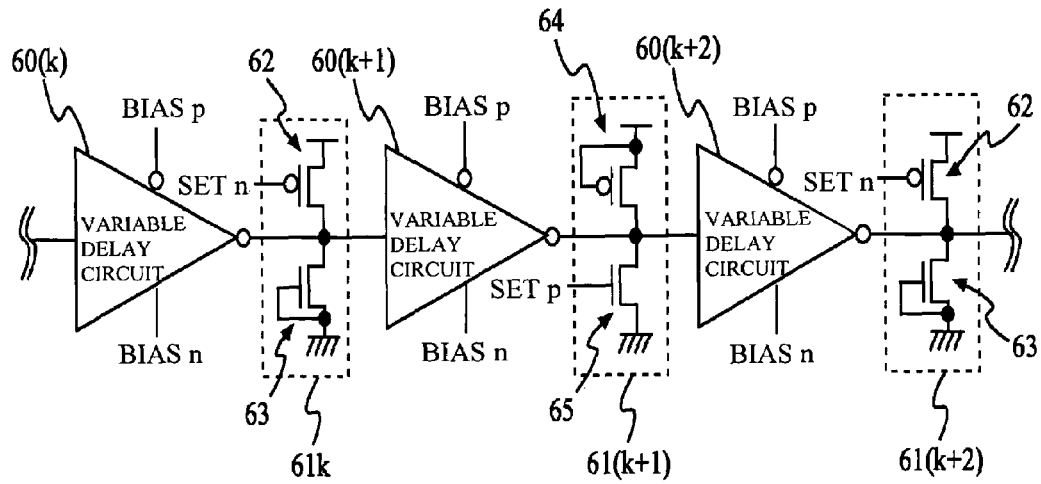
FIG. 11 is a diagram that shows a configuration of a ring oscillator that includes variable delay circuits 60 configured with single-end inverters and output fixing units 61.

FIG. 11 shows a configuration in which single-end variable delay circuits (i.e., inverters) 60 are used in the voltage controlled oscillator 8. As shown in FIG. 11, at the output terminals of the variable delay circuits 60(*k*) and 60(*k*+2), output fixing units 61(*k*) and 61(*k*+2) each of which is operable to fix the output of the corresponding one of the variable delay circuits so as to be at the high level are provided, respectively. With the output terminal of the variable delay circuit 60(*k*+1), an output fixing unit 61(*k*+1) that is operable to fix the output of the variable delay circuit so as to be at the low level is provided.

The output fixing unit 61(*k*) that is operable to fix the output of the variable delay circuit 60(*k*) so as to be at the high level includes a PMOS transistor 62 and an NMOS transistor 63. In the PMOS transistor 62, the source is connected to the power supply voltage, while the drain is connected to the output terminal, and the set n signal is input to the gate. In the NMOS transistor 63, the drain is connected to the output terminal, while the source is connected to the ground, and the gate and the source are connected to each other. The configuration of the output fixing unit 61(*k*+2) that is operable to fix the output of the variable delay circuit 60(*k*+2) so as to be at the high level is the same as the configuration of the output fixing unit 61(*k*). Thus, the explanation thereof will be omitted.

The output fixing unit 61(*k*+1) that is operable to fix the output of the variable delay circuit 60(*k*+1) so as to be at the low level includes a PMOS transistor 64 and an NMOS transistor 65. In the PMOS transistor 64, the source is connected to the power supply voltage, while the drain is connected to the output terminal, and the gate and the source are connected to each other. In the NMOS transistor 65, the drain is connected to the output terminal, while the source is connected to the ground, and the set p signal is input to the gate.

By arranging the set n signal so as to be at the low level, it is possible to turn on the PMOS transistor 62, and to fix the output terminal so as to be at the high level. By arranging the set p signal so as to be at the high level, it is possible to turn on the NMOS transistor 65, and to fix the output terminal so as to be at the low level.

FIG. 12 shows examples of other configurations of the output fixing unit 61(*k*) that is operable to fix the output terminal of the single-end variable delay circuit 60(*k*) so as to be at the high level or at the low level. The output fixing unit 61(*k*) shown in FIG. 12(A) is operable to fix the output terminal of the variable delay circuit 60(*k*) so as to be at the high level. The output fixing unit 61(*k*) is provided with an NMOS transistor 66 in which the source is connected to the output terminal, while the set p signal is input to the gate, and the drain and the gate are connected to each other. FIG. 12(B) shows another configuration that can form a pair with the configuration of the output fixing unit 61(*k*) shown in FIG. 12(A) and in which the output fixing unit 61(*k*) is operable to fix the output terminal of the variable delay circuit 60(*k*) so as to be at the low level. The output fixing unit 61(*k*) is provided with an NMOS transistor 67 in which the source is connected to the ground, while the drain is connected to the output terminal, and the set p signal is input to the gate.

Figure 12A:
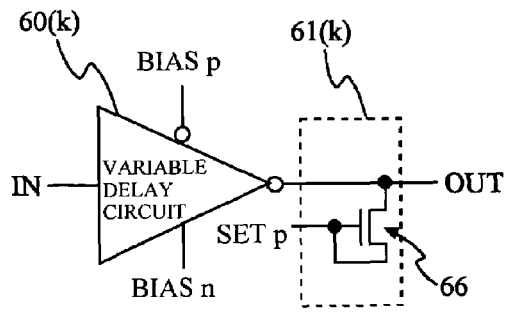
FIGS. 12(A), 12(B), 12(C), and 12(D) are diagrams each of which shows a configuration of the output fixing unit 61.
Figure 12B:
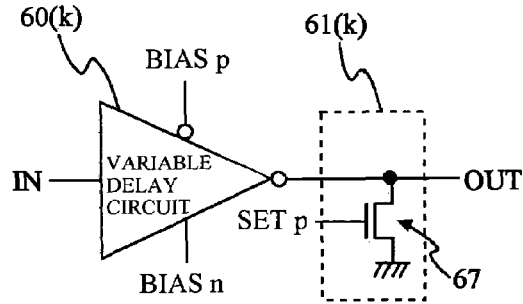
Figure 12C:
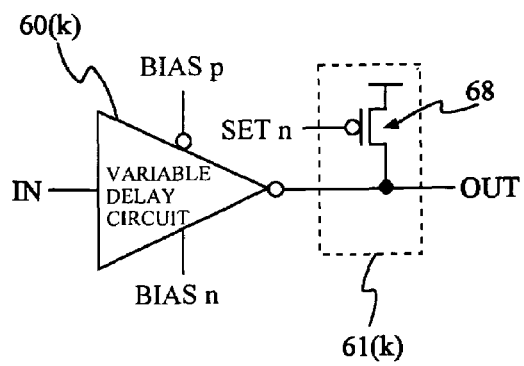
Figure 12D:
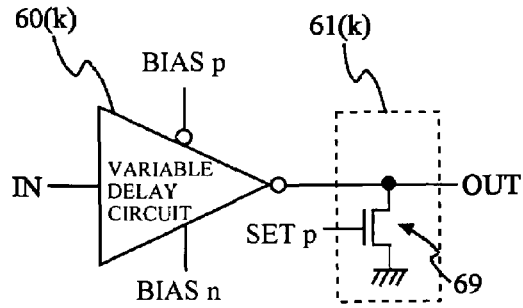

The output fixing unit 61(*k*) shown in FIG. 12(C) is also operable to fix the output terminal of the variable delay circuit 60(*k*) so as to be at the high level. The output fixing unit 61(*k*) is provided with a PMOS transistor 68 in which the source is connected to the power supply voltage, while the set n signal is input to the gate, and the drain is connected to the output terminal. FIG. 12(D) shows another configuration that can form a pair with the configuration of the output fixing unit 61(*k*) shown in FIG. 12(C) and in which the output fixing unit 61(*k*) is operable to fix the output terminal of the variable delay circuit 60(*k*) so as to be at the low level. The output fixing unit 61(*k*) is provided with an NMOS transistor 69 in which the source is connected to the ground, while the drain is connected to the output terminal, and the set p signal is input to the gate.

In the description of the first embodiment above, all of the variable delay circuits 30 and 60 are provided with the output fixing unit 31 or the output fixing unit 61. However, it is not necessary to provide the output fixing unit 31 or the output fixing unit 61 at all of the variable delay circuits 30 and 60. It is acceptable if at least one of the variable delay circuits 30 and at least one of the variable delay circuits 60 are provided with the output fixing unit 31 or the output fixing unit 61. By having an arrangement in which the output of at least one of the variable delay circuits is fixed so that the output is not in an inconstant state, it is possible to ensure that the PLL operates in a stable manner because the output voltage of the variable delay circuit of which the output is fixed can serve as a trigger when the PLL starts or resumes its operation, for example, immediately after the electric power is turned on or when the PLL has recovered from an operation stop state.

In the description of the first embodiment, as explained with reference to FIG. 6, both of the following two configurations are used: the configuration in which the input voltage of the converting circuit 12 is fixed so as to be the predetermined high voltage with the use of the PLL power down signal so that the voltage controlled oscillator starts oscillating with a high frequency in a stable manner, for example, immediately after the electric power is turned on; and the configuration in which the output fixing units are provided at the variable delay circuits so that the output voltages of the variable delay circuits are fixed with the use of the set signals that are based on the PLL power down signal, and as a result, the voltage controlled oscillator oscillates in a stable manner, for example, immediately after the electric power is turned on. However, even if only one of the two configurations is used, it is possible to ensure that the voltage controlled oscillator starts oscillating in a stable manner, for example, immediately after the electric power is turned on.

Second Embodiment

Figure 13:
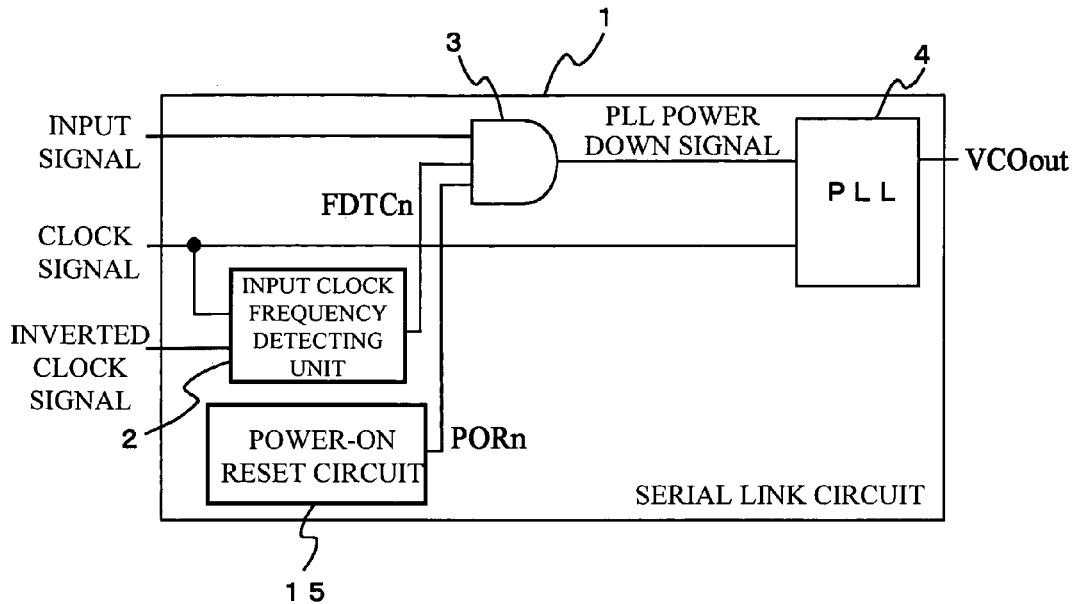
FIG. 13 is a diagram that shows a configuration according to a second embodiment of the present invention.

Next, a second embodiment of the present invention will be explained. According to the present embodiment, as shown in FIG. 13, a power-on reset circuit 15 that serves as power supply voltage detecting means is further provided. The power-on reset circuit 15 obtains a voltage that is based on the power supply voltage, and when the power supply voltage rises to an electric potential that is specified in advance, the power-on reset circuit 15 outputs an output signal PORn indicating the high level. The power-on reset circuit 15 may have any configuration as long as the power-on reset circuit 15 outputs the output signal PORn indicating the high level, when the power supply voltage rises to the electric potential that is specified in advance. For example, it is acceptable to configure the power-on reset circuit 15 with a latch circuit and a transistor. In the second embodiment, it is assumed that the output signal PORn is at the low level when the electric power is turned on.

Figure 14:
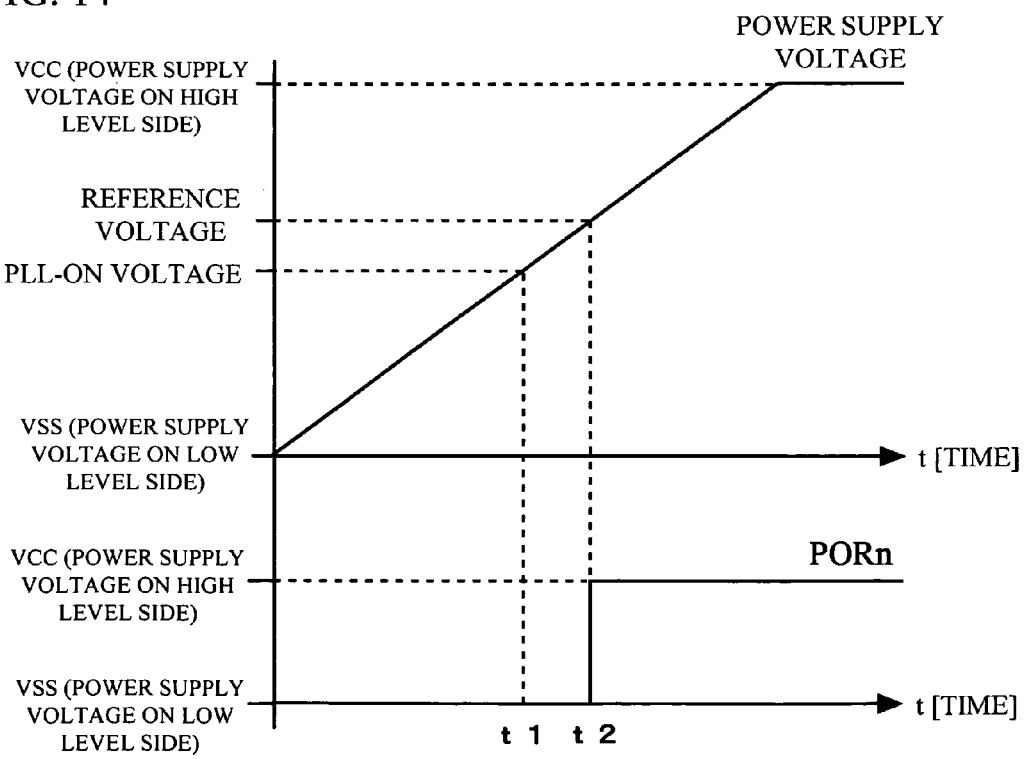
FIG. 14 is a timing chart that shows a relationship between a power supply voltage and a power-on reset signal.
Figure 15:
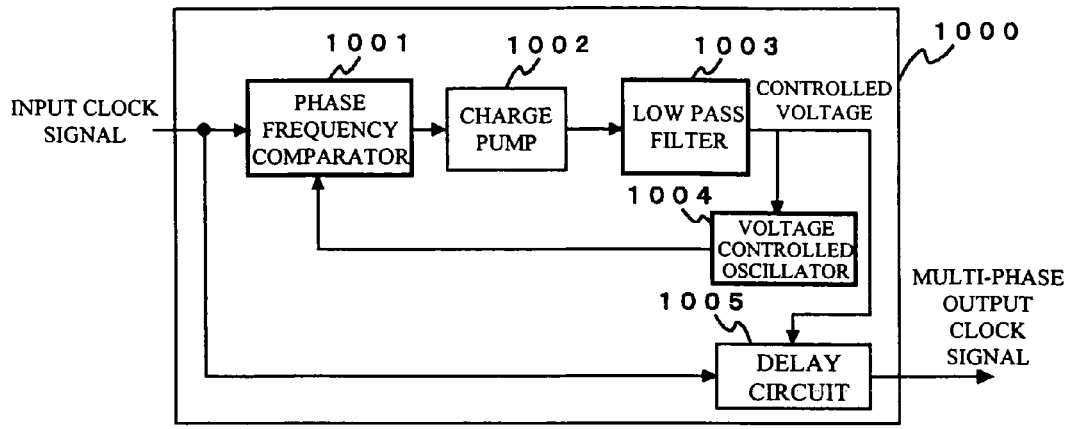
FIG. 15 is a diagram that shows a configuration of a PLL circuit 1000 disclosed in Patent Document 1.
Figure 16:
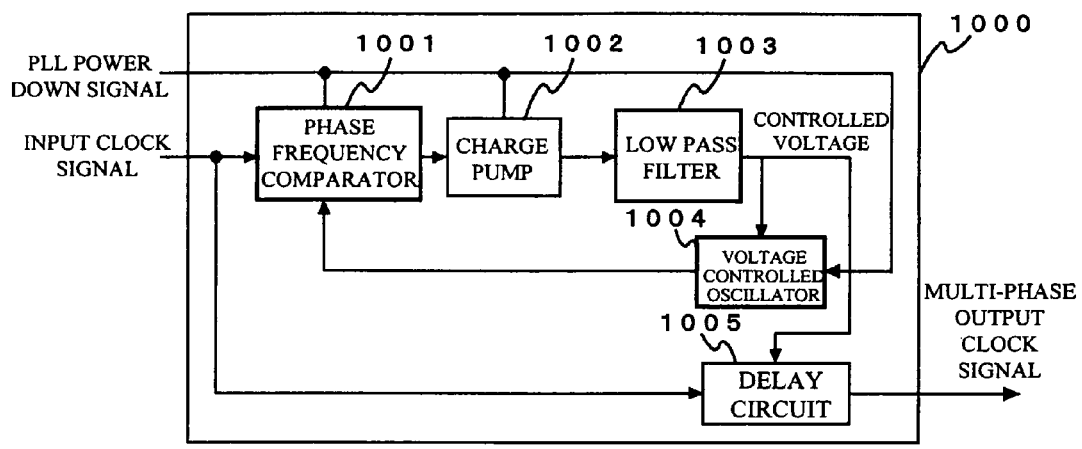
FIG. 16 is a diagram that shows another configuration of the PLL circuit 1000 that has an operation stopping function.
Figure 17:
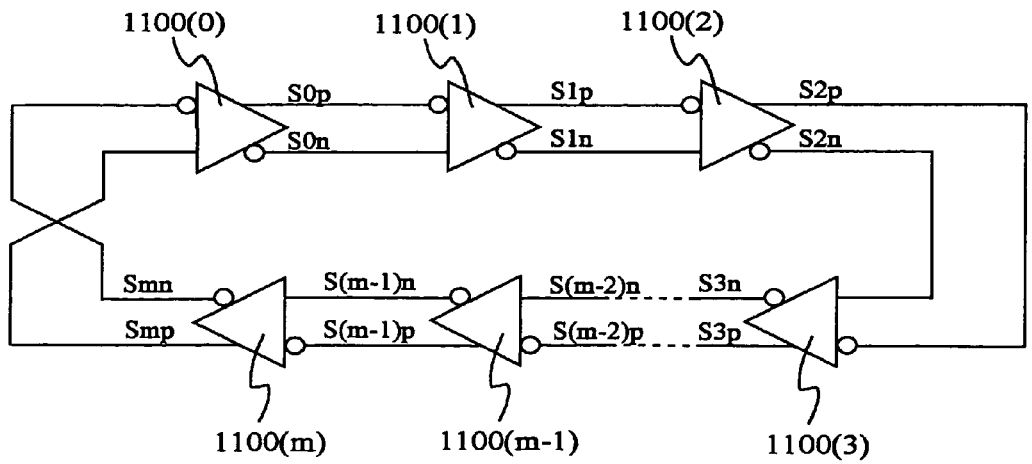
FIG. 17 is a diagram that shows a ring oscillator that includes variable delay circuits 1100.

FIG. 14 shows a relationship between the power supply voltage and the output signal PORn that is output from the power-on reset circuit 15. The PLL-ON voltage shown in FIG. 14 indicates a voltage at which the serial link circuit 1 starts operating. The reference voltage shown in FIG. 14 is a voltage at which the power-on reset circuit 15 changes the output signal PORn so as to be at the high level and cancels a reset state of the serial link circuit 1. The time t1 indicates a time at which the voltage reaches the PLL-ON voltage, whereas the time t2 indicates a time at which the voltage reaches the reference voltage.

As shown in FIG. 14, even if the voltage comes to a level (i.e., the PLL-ON voltage) with which the PLL unit 4 is able to operate, the power-on reset circuit 15 fixes the PORn signal so as to be at the low level and puts the operation of the PLL unit 4 into a reset state (i.e., the operation stop state). Further, when the power supply voltage rises up to the reference voltage, the power-on reset circuit 15 changes the PORn signal so as to be at the high level and cancels the reset state. Accordingly, the PLL unit 4 is in a power down state between the time t1 and the time t2 shown in FIG. 14.

The power-on reset circuit 15 configured as described above is provided so that a logical product of the output signal PORn from the power-on reset circuit 15, the flag signal (FDTCn) from the input clock frequency detecting unit 2, and the external control signal is calculated and is output as a PLL power down signal. By controlling the PLL unit with the PLL power down signal, even in an inconstant state immediately after the electric power is turned on, it is possible to put the PLL unit 4 into the reset state so that the PLL unit 4 is in the operation stop state.

The exemplary embodiments described above are preferred embodiments of the present invention. However, the present invention is not limited to these examples. It is possible to embody the present invention with various modifications without departing from the scope of the present invention.

The invention claimed is:

1. A phase-locked loop circuit comprising:
   input clock frequency detecting means for detecting whether a frequency of an input clock has become equal to or lower than a predetermined frequency and for outputting a PLL control signal based on a result of the frequency detection;
   a PLL unit that includes phase frequency comparing means for detecting a phase difference between a phase of the input clock and an output signal from a voltage controlled oscillator, error signal generating means for generating an error signal in accordance with the detected phase difference, and the voltage controlled oscillator that outputs, based on the error signal, an oscillation signal having a predetermined frequency; and
   oscillator input voltage fixing means for fixing, in a case where the frequency of the input clock has become equal to or lower than the predetermined frequency, an input voltage of the voltage controlled oscillator so as to be a predetermined high voltage that is specified in advance, based on the PLL control signal, wherein:
   the input clock frequency detecting means includes a logical operation circuit that performs a logical operation on an external control signal and the result of the frequency detection, the external control signal being input from outside in order to control an operation of the PLL unit;

the PLL control signal is an output signal from the logical operation circuit;

in the case where the frequency of the input clock has become equal to or lower than the predetermined frequency or in a case where the external control signal is a control signal for causing the PLL unit to stop, the oscillator input voltage fixing means fixes the input voltage of the voltage controlled oscillator so as to be the predetermined high voltage that is specified in advance;

the input clock frequency detecting means includes power supply voltage detecting means for detecting whether a power supply voltage has exceeded a reference voltage that is higher than a PLL-ON voltage which is a voltage with which the PLL unit is able to oscillate properly even if starting from a low voltage state;

the logical operation circuit performs the logical operation based on the external control signal, the result of the frequency detection, and a result of the power supply voltage detection; and the oscillator input voltage fixing means fixes, based on the PLL control signal, the input voltage of the voltage controlled oscillator so as to be the predetermined high voltage that is specified in advance, until the power supply voltage exceeds the reference voltage that is higher than the PLL-ON voltage which is the voltage with which the PLL unit is able to oscillate properly even if starting from the low voltage state.

2. A phase-locked loop circuit comprising:

input clock frequency detecting means for detecting whether a frequency of an input clock has become equal to or lower than a predetermined frequency and for outputting a PLL control signal based on a result of the frequency detection;

a PLL unit that includes phase frequency comparing means for detecting a phase difference between a phase of the input clock and an output signal from a voltage controlled oscillator, error signal generating means for generating an error signal in accordance with the detected phase difference, and the voltage controlled oscillator that outputs, based on the error signal, an oscillation signal having a predetermined frequency; and oscillator input voltage fixing means for fixing, in a case where the frequency of the input clock has become equal to or lower than the predetermined frequency, an input voltage of the voltage controlled oscillator so as to be a predetermined high voltage that is specified in advance, based on the PLL control signal, wherein:

the input clock frequency detecting means includes a logical operation circuit that performs a logical operation on an external control signal and the result of the frequency detection, the external control signal being input from outside in order to control an operation of the PLL unit;

the PLL control signal is an output signal from the logical operation circuit;

in the case where the frequency of the input clock has become equal to or lower than the predetermined frequency or in a case where the external control signal is a control signal for causing the PLL unit to stop the oscillator input voltage fixing means fixes the input voltage of the voltage controlled oscillator so as to be the predetermined high voltage that is specified in advance;

the oscillator input voltage fixing means is an NMOS transistor in which a drain is connected to the power supply voltage, while a source is connected to a point between a resistor and a capacitor that form a low pass filter connected between a wiring for the error signal and a ground potential, and the PLL control signal is input to a gate; and the predetermined high voltage is lower than the power supply voltage.

3. A phase-locked loop circuit comprising:

input clock frequency detecting means for detecting whether a frequency of an input clock has become equal to or lower than a predetermined frequency and for outputting a PLL control signal based on a result of the frequency detection;

a PLL unit that includes phase frequency comparing means for detecting a phase difference between a phase of the input clock and an output signal from a voltage controlled oscillator, error signal generating means for generating an error signal in accordance with the detected phase difference, and the voltage controlled oscillator in which a plurality of variable delay circuits that are operable to make a delay in accordance with the error signal are connected to one another so as to form a ring and which is operable to output an oscillation signal having a predetermined frequency; and delay circuit output voltage fixing means for fixing, in a case where the frequency of the input clock has become equal to or lower than the predetermined frequency, an output voltage of at least one of the variable delay circuits so as to be a predetermined voltage that is specified in advance, based on the PLL control signal, wherein:

the input clock frequency detecting means includes a logical operation circuit that performs a logical operation on an external control signal and the result of the frequency detection, the external control signal being input from outside in order to control an operation of the PLL unit;

the PLL control signal is an output signal from the logical operation circuit; and in the case where the frequency of the input clock has become equal to or lower than the predetermined frequency or in a case where the external control signal is a control signal for causing the PLL unit to stop, the delay circuit output voltage fixing means fixes the output voltage of the at least one of the variable delay circuits so as to be the predetermined voltage that is specified in advance.

4. The phase-locked loop circuit according to claim 3, wherein:

the input clock frequency detecting means includes power supply voltage detecting means for detecting whether a power supply voltage has exceeded a reference voltage that is higher than a PLL-ON voltage which is a voltage with which the PLL unit is able to oscillate properly even if starting from a low voltage state;

the logical operation circuit performs the logical operation based on the external control signal, the result of the frequency detection, and a result of the power supply voltage detection; and the delay circuit output voltage fixing means fixes, based on the PLL control signal, the output voltage of the at least one of the variable delay circuits so as to be the predetermined voltage that is specified in advance, until the power supply voltage exceeds the reference voltage that is higher than the PLL-ON voltage which is the voltage with which the PLL unit is able to oscillate properly even if starting from the low voltage state.

5. The phase-locked loop circuit according to claim 3, wherein:

the delay circuit output voltage fixing means is a transistor of which one end is connected to an input terminal of the at least one of the circuits variable delay; whereas another end is connected to at least one of the power supply voltage, a ground, and a gate, while the PLL control signal is input to the gate; and the delay circuit output voltage fixing means fixes, based on the PLL control signal, the output voltage of the at least one of the variable delay circuits so as to be one of the power supply voltage, a ground potential, and a level of the PLL control signal output by the input clock frequency detecting means.

* * * * *